(12) United States Patent
Choi et al.

(10) Patent No.: US 9,368,757 B2
(45) Date of Patent: Jun. 14, 2016

(54) ORGANIC LIGHT EMITTING DISPLAY DEVICE INCLUDING GRADED FUNCTIONAL LAYERS

(71) Applicant: SAMSUNG DISPLAY CO., LTD., Yongin, Gyeonggi-Do (KR)

(72) Inventors: Hae-Yun Choi, Hwaseong-si (KR); Jae-Ik Lim, Hwaseong-si (KR); Jin-Woo Choi, Seoul (KR)

(73) Assignee: Samsung Display Co., Ltd. (KR)

( * ) Notice: Subject to any disclaimer, the term of this patent is extended or adjusted under 35 U.S.C. 154(b) by 16 days.

(21) Appl. No.: 14/095,581

(22) Filed: Dec. 3, 2013

(65) Prior Publication Data
US 2014/0361264 A1    Dec. 11, 2014

(30) Foreign Application Priority Data
Jun. 10, 2013    (KR) .......................... 10 2013 0065667

(51) Int. Cl.
*H01L 35/24*    (2006.01)
*H01L 51/00*    (2006.01)
*H01L 33/00*    (2010.01)
*H01L 51/52*    (2006.01)
*H01L 27/32*    (2006.01)

(52) U.S. Cl.
CPC ........ *H01L 51/5275* (2013.01); *H01L 51/5284* (2013.01); *H01L 27/3244* (2013.01); *H01L 2227/323* (2013.01)

(58) Field of Classification Search
None
See application file for complete search history.

(56) References Cited

U.S. PATENT DOCUMENTS

| | | | |
|---|---|---|---|
| 2004/0070558 A1* | 4/2004 | Cok et al. .......................... | 345/76 |
| 2005/0057705 A1* | 3/2005 | Yamanaka et al. ............... | 349/95 |
| 2011/0121271 A1 | 5/2011 | Jeon et al. | |
| 2012/0104367 A1* | 5/2012 | Hasegawa et al. ............... | 257/40 |
| 2012/0139964 A1 | 6/2012 | Han et al. | |
| 2012/0218173 A1* | 8/2012 | Ohta et al. ....................... | 345/76 |
| 2013/0037828 A1 | 2/2013 | Moon et al. | |

FOREIGN PATENT DOCUMENTS

| | | |
|---|---|---|
| KR | 1020110058126 A | 6/2011 |
| KR | 1020120061556 A | 6/2012 |
| KR | 1020130016937 A | 2/2013 |

* cited by examiner

*Primary Examiner* — Mohammed Islam
*Assistant Examiner* — Jay C Chang
(74) *Attorney, Agent, or Firm* — Innovation Counsel LLP

(57) ABSTRACT

An organic light emitting display device includes a substrate, a plurality of organic light emitting elements disposed on the substrate, the plurality of organic light emitting elements including a first organic light emitting element, a second organic light emitting element and a third organic light emitting element, an encapsulating member encapsulating the plurality of organic light emitting elements, a graded functional layers disposed on the encapsulating member, the graded functional layers including convex lenses disposed on pixel regions, and a black matrix disposed on the graded functional layer.

15 Claims, 10 Drawing Sheets

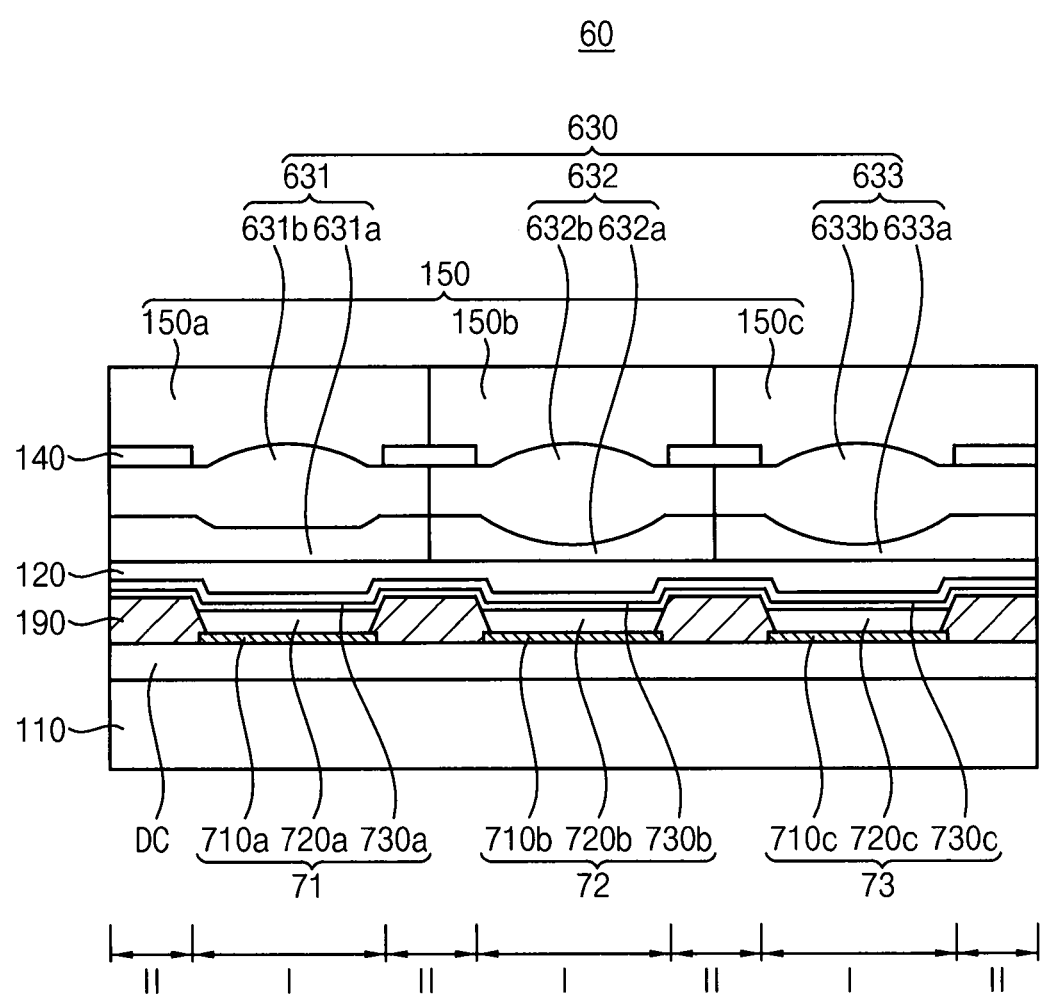

ORGANIC LIGHT EMITTING DISPLAY DEVICE INCLUDING GRADED FUNCTIONAL LAYERS

CROSS-REFERENCE TO RELATED APPLICATION(S)

This application claims priority under 35 U.S.C. §119 to Korean patent Application No. 10-2013-0065667, filed on Jun. 10, 2013, the disclosure of which is hereby incorporated by reference herein in its entirety.

BACKGROUND

1. Technical Field

Exemplary embodiments relate generally to an organic light emitting display device. More particularly, embodiments of the inventive concept relate to an organic light emitting display device having an improved optical efficiency, and a method of manufacturing the organic light emitting display device.

2. Description of the Related Art

An organic light emitting display device displays desired information such as images, letters and/or characters using light from organic light emitting diodes. The light of the organic light emitting display device is generated by combining holes provided from an anode with electrons provided from a cathode in an organic layer. The organic light emitting display device ensures relatively wide viewing angle, rapid response time, small thickness, low power consumption, etc. Accordingly, the organic light emitting display device has been considered to be one of the most prospecting next-generation display devices.

However, the light emitted from the organic light emitting layer does not have directivity and is emitted uniformly to all direction. Accordingly, a ratio of the number of photons (i.e., external light extraction efficiency) arrived to an observer among the total photon generated from the organic light emitting layer becomes low.

SUMMARY

Exemplary embodiments provide an organic light emitting display device having an improved optical efficiency.

Exemplary embodiments provide a method of manufacturing the organic light emitting display device.

According to some exemplary embodiments, an organic light emitting display device includes a substrate, a plurality of organic light emitting elements disposed on the substrate, the plurality of organic light emitting elements including a first organic light emitting element, a second organic light emitting element and a third organic light emitting element, an encapsulating member encapsulating the plurality of organic light emitting elements, a graded functional layers disposed on the encapsulating member, the graded functional layers including convex lenses disposed on pixel regions, and a black matrix disposed on the graded functional layer.

In exemplary embodiments, the graded functional layer may include a low refractive film and a high refractive film, and the convex lenses may be formed of the high refractive film, the convex lenses including a first convex lens disposed on the first organic light emitting element, a second convex lens disposed on the second organic light emitting element and a third convex lens disposed on the third organic light emitting element.

In exemplary embodiments, the first organic light emitting element may be a red organic light emitting element, the second organic light emitting element is a green organic light emitting element and the third organic light emitting element is a blue organic light emitting element.

In exemplary embodiments, each of the first convex lens, the second convex lens and the third convex lens may have an upper region and a lower region, and the third convex lens may have a flat portion on the lower region.

In exemplary embodiments, a refractive index and a width of the third convex lens may be different from those of the first convex lens and the second convex lens.

In exemplary embodiments, a taper angle of the third convex lens may be different from that of the second convex lens and the third convex lens.

In exemplary embodiments, each of the first convex lens, the second convex lens and the third convex lens may have an upper region and a lower region, and the first convex lens and the second convex lens may have a flat portion on the upper region.

In exemplary embodiments, a width of the third convex lens may be different from that of the first convex lens and the second convex lens.

In exemplary embodiments, a taper angle of the lower region in the third convex lens may be different from that of the lower region in the first convex lens and the lower region in the second convex lens.

In exemplary embodiments, a height of the lower region in the third convex lens may be different from that of the lower region in the first convex lens and the lower region in the second convex lens.

In exemplary embodiments, the first organic light emitting element, the second organic light emitting element and the third organic light emitting element may be white organic light emitting elements.

In exemplary embodiments, each of the first convex lens, the second convex lens and the third convex lens may have an upper region and a lower region, and the third convex lens may have a flat portion on the lower region.

In exemplary embodiments, a refractive index and a width of the third convex lens may be different from those of the first convex lens and the second convex lens.

In exemplary embodiments, a taper angle of the third convex lens may be different from that of the first convex lens and the second convex lens.

According to some exemplary embodiments, a method of manufacturing the organic light emitting display device is provided as follows. An organic light emitting element is formed on a substrate. An encapsulating member is formed on the substrate. The encapsulating member encapsulates the organic light emitting element. A graded functional layer is formed on the encapsulating member. The graded functional layers may include convex lenses disposed on pixel regions. A black matrix is formed on the graded functional layer. A color filter layer is formed on the black matrix.

In exemplary embodiments, the organic light emitting display device may include a first electrode, a second electrode, a first light emitting layer, a second light emitting layer, and a third light emitting layer. The first electrode may be disposed on the substrate. The second electrode may oppose the first electrode. The first light emitting layer may be disposed between the first electrode and the second electrode. The second light emitting layer may be disposed on the first light emitting layer. The third light emitting layer may be disposed on the second light emitting layer. The graded functional layer may have different refractive indexes corresponding to the first to third organic light emitting layers.

In exemplary embodiments, the graded functional layer may include a first functional layer, a second functional layer, and a third functional layer. The first functional layer may be disposed over the first organic light emitting layer. The second functional layer may be disposed over the second organic light emitting layer. The third functional layer may be disposed over the third organic light emitting layer. Each of the first to third functional layers may have at least one of a refractive index, a width, and a height different from each other corresponding to the first to third organic light emitting layers.

Therefore, the organic light emitting display device according to exemplary embodiments may include a black matrix and a color filter layer. Accordingly, the organic light emitting display device may have an improved contrast. In addition, the organic light emitting display device may include a graded functional layer having at least one low refractive film and high refractive film having convex lens. Accordingly, light generated from an organic light emitting element of the organic light emitting display device may be effectively amplified due to difference of refractive index between the low refractive film and the high refractive film. Thus, the organic light emitting display may have an improved optical efficiency. In this case, the organic light emitting display device may prevent a color shift in which the light generated from the organic light emitting element may be scattered due to the shape of the low refractive film and the high refractive film.

BRIEF DESCRIPTION OF THE DRAWINGS

Illustrative, non-limiting exemplary embodiments will be more clearly understood with reference to the following detailed description and accompanying drawings.

FIG. 12 is a cross-sectional view illustrating an organic light emitting display device in accordance with embodiments.

DETAILED DESCRIPTION OF THE EMBODIMENTS

Figure 1:
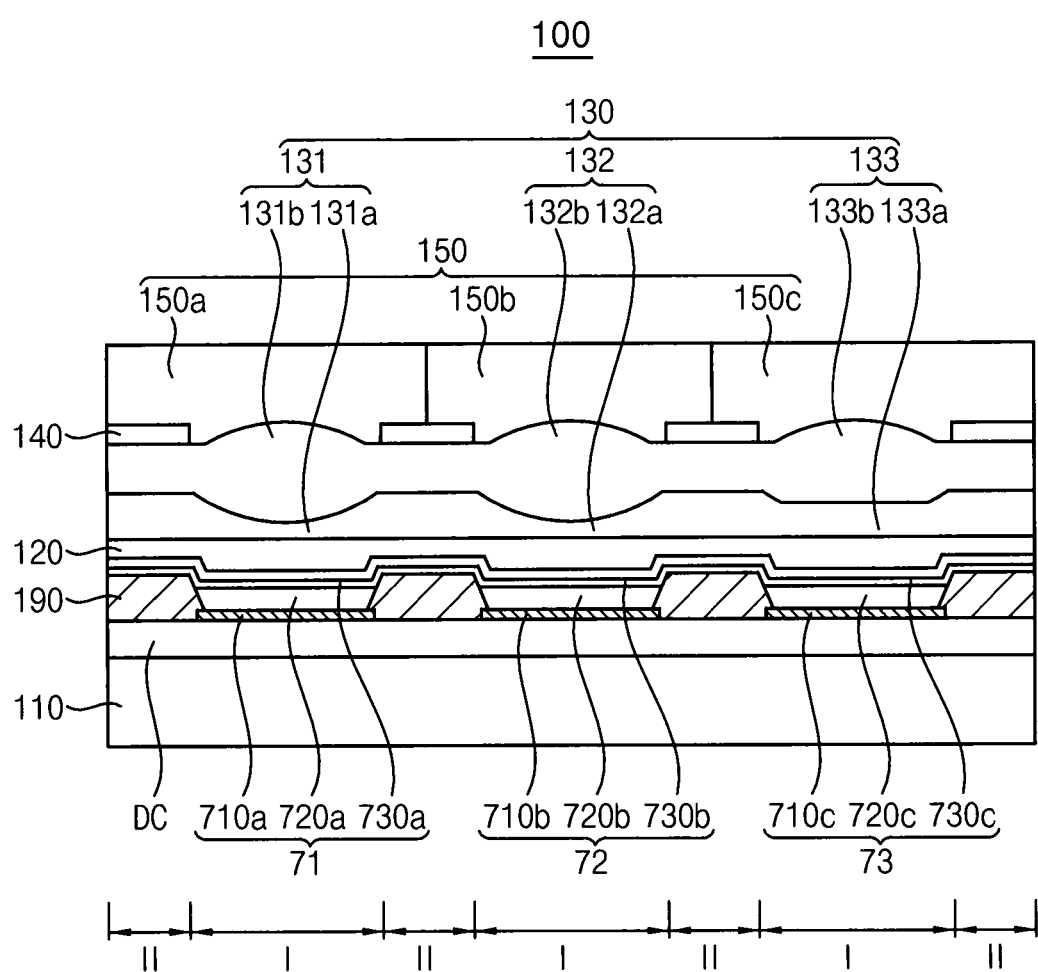
FIG. 1 is a cross-sectional view illustrating an organic light emitting display device in accordance with embodiments of the present invention.

Various exemplary embodiments will be described more fully hereinafter with reference to the accompanying drawings, in which some exemplary embodiments are shown. The present inventive concept may, however, be embodied in many different forms and should not be construed as limited to the exemplary embodiments set forth herein. Rather, these exemplary embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or it can be connected or coupled to the element with intervening elements. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating an organic light emitting display device in accordance with embodiments.

Referring to FIG. 1, an organic light emitting display device 100 may include a substrate 110, a driving circuit unit DC, a first organic light emitting element 71, a second organic light emitting element 72, a third organic light emitting element 73, an encapsulating member 120, a graded functional layer 130, a black matrix 140, a color filter layer 150, etc.

The substrate 110 may include a glass substrate, a quartz substrate, a transparent resin substrate, etc. Examples of the transparent resin substrate for the substrate 110 may include polyimide-based resin, acryl-based resin, polyacrylate-based resin, polycarbonate-based resin, polyether-based resin, sulfonic acid-containing resin, polyethyleneterephthalate-based resin, etc.

The substrate 110 may include a plurality of pixel regions I and a peripheral region II. The plurality of pixel regions I may be arranged in a first direction and a second direction substantially perpendicular to the first direction, and the peripheral region II may surround the plurality of pixel regions I. The plurality of pixel regions I may correspond to regions for generating a light from the organic light emitting layers 720a, 720b and 720c and the peripheral region II may separate the plurality of pixel regions I.

In exemplary embodiments, the buffer layer (not shown) may be provided on the substrate 110. The buffer layer may prevent diffusion of metal atoms and/or impurities from the substrate to the driving circuit unit DC and the first to the third organic light emitting elements 71, 72 and 73. In case that the substrate 110 may have a relatively irregular surface, the buffer layer may improve flatness of the surface of the substrate 110. The buffer layer may be formed using a silicon compound. For example, the buffer layer may include silicon oxide (SiOx), silicon nitride (SiNx), silicon oxynitride (SiOxNy), silicon oxycarbide (SiOxCy), silicon carbon nitride (SiCxNy), etc. These may be used alone or in any combination thereof. The buffer layer may have a single layer structure or a multi layer structure. For example, the buffer layer may have a single layer structure including a silicon oxide film, a silicon nitride film, a silicon oxynitride film, a silicon oxycarbide film, or a silicon carbon nitride film. Alternatively, the buffer layer may have a multi layer structure including at least two of a silicon oxide film, a silicon nitride film, a silicon oxynitride film, a silicon oxycarbide film, a silicon carbon nitride film, etc.

The driving circuit unit DC may be formed on the buffer layer. In exemplary embodiments, the driving circuit unit DC may include a plurality of transistors and may operate the first to the third organic light emitting elements 71, 72 and 73. The first to the third organic light emitting elements 71, 72 and 73 may display an image based on a driving signal received from the driving circuit unit DC.

The first to the third organic light emitting elements 71, 72 and 73 may include a first electrodes 710a, 710b and 710c, a second electrodes 730a, 730b and 730c, a first organic light emitting layer 720a, a second organic light emitting layer 720b, a third organic light emitting layer 720c, etc., respectively. In this case, the first to the third organic light emitting layers may be disposed between the first electrodes 710a, 710b and 710c, and the second electrode 730a, 730b and 730c.

The first electrodes 710a, 710b and 710c may be disposed on the pixel region I of the substrate 110. The first electrodes 710a, 710b and 710c may include a reflective material or a transparent material in accordance with the emission type of the display device. In exemplary embodiments, when the first electrodes 710a, 710b and 710c include the transparent material, the first electrode 710a, 710b and 710c may be formed using indium zinc oxide (IZO), indium tin oxide (ITO), gallium tin oxide (GTO), zinc oxide (ZnOx), gallium oxide (GaOx), tin oxide (TiOx), indium oxide (InOx), mixtures thereof. Alternatively, when the first electrodes 710a, 710b and 710c include the reflective material, the first electrode 710a, 710b and 710c may be formed using aluminum (Al), silver (Ag), platinum (Pt), chrome (Cr), tungsten (W), molybdenum (Mo), palladium (Pd), alloys thereof.

The pixel defining layer 190 may be disposed on the substrate in the peripheral region II. In exemplary embodiments, the pixel defining layer 190 may be disposed adjacent to the first electrodes 710a, 710b and 710c, and a portion of the pixel defining layer 190 may be overlapped with the first electrodes 710a, 710b and 710c. Alternatively, the pixel defining layer 190 may not be overlapped with the first electrodes 710a, 710b and 710c.

The pixel defining layer 190 may be formed using an organic material or an inorganic material. For example, the pixel defining layer 190 may be formed photoresist, polyacryl-based resin, polyimid-based resin, a silicon compound, etc.

In exemplary embodiments, the pixel defining layer 190 may be partially etched to form an opening partially exposing the first electrodes 710a, 710b and 710c. The opening of the pixel defining layer 190 may define the pixel regions I and the peripheral regions II of the organic light emitting display device 100. For example, a portion having the opening of the pixel defining layer 190 may be the pixel regions I of the organic light emitting display device 100 while another portion around the opening of the pixel defining layer 190 may be the peripheral regions II of the organic light emitting display device 100.

The first to the third organic light layers 720a, 720b and 720c may be formed on the exposed portions of the first electrodes 710a, 710b and 710c. In exemplary embodiments, the first to the third organic light layers 720a, 720b and 720c may include light emitting materials for generating different colored light such as a red colored light (R), a green colored light (G) and a blue colored light (B) in accordance with color pixels of the organic light emitting display device 100. Alternatively, the organic light emitting layer of the organic light emitting structure 190 may include a plurality of stacked light emitting materials for generating a red colored light, a green colored light, and a blue colored light to thereby emitting a white color of light.

The organic light emitting display device 100 may further include a hole injection layer and a hole transport layer. The hole injection layer may be disposed on the first electrode 710 and the pixel defining layer 190, and the hole transport layer may be disposed on the first electrode 710 or the hole injection layer. The hole injection layer may promote a hole injection from the first electrode 710 into the first to the third organic light layers 720a, 720b and 720c. For example, the hole injection layer may include CuPc (cupper phthalocyanine), PEDOT (poly(3,4)-ethylenedioxythiophene), PANI (polyaniline), NPD (N,N-dinaphthyl-N,N'-diphenyl benzidine), etc., however, a material in the hole injection layer may not be limited thereto. The hole transport layer may improve a hole movement from the hole injection layer. For example, the hole transport layer may include NPD (N, N-dinaphthyl-N,N'-diphenylbenzidine), TPD (N,N'-bis-(3-methylphenyl)-N, N'-bis-(phenyl)-benzidine), s-TAD, MTDATA (4,4',4"-Tris(N-3-methylphenyl-N-phenyl-amino)-triphenylamine), etc., however, a material in the hole transfer layer 150 may not be limited thereto.

The second electrode 730 may cover the first to the third organic light layers 720a, 720b and 720c in the pixel region I and the peripheral region II. The second electrodes 730a, 730b and 730c may be a reflective electrode or a transmissive electrode depending on the type of the first electrodes 710a, 710b and 710c. When the first electrodes 710 a, 710b and 710c are the transmissive electrodes, the second electrode 730a, 730b and 730c may be the reflective electrode. In this case, the second electrodes 730 a, 730b and 730c may include Al, W, Cu, Ni, Cr, Mo, Ti, Pt, Ag, Ta, Ru, alloys thereof. Alternatively, when the first electrodes 710a, 710b and 710c are the reflective electrode, the second electrodes 730a, 730b and 730c may be the transmissive electrode, and may include ITO, IZO, ZTO, GTO, ZnOx, InOx, SnOx, GaOx or mixtures thereof.

In exemplary embodiments, the first electrode 710a, 710b and 710c may serve as an anode, and the hole injection layer and the hole transfer layer may be disposed between the first electrodes 710 a, 710b and 710c and the first to the third organic light layers 720a, 720b and 720c as illustrated in FIG. 1. However, the inventive concept may not be limited to the above-described construction. For example, the first electrodes 710a, 710b and 710c may serve as a cathode. In this case, an electron transport layer and an electron injection layer may be disposed between the first electrodes 710a, 710b and 710c and the first to the third organic light layers 720a, 720b and 720c.

The encapsulating member 120 may be disposed on the second electrode 730a, 730b and 730c to encapsulate the first to the third organic light emitting element 720a, 720b and 720c. In exemplary embodiments, the encapsulating member 120 may have a single layer structure or a multi layer structure, which may include an inorganic material and an organic material.

The graded functional layer 130 may be disposed on the encapsulating member 120. In exemplary embodiments, the graded functional layer 130 may have at least one refractive film. The refractive film may have different refractive indexes.

The graded functional layer 130 may have a first functional layer 131 disposed over the first organic light emitting layer 720a, a second functional layer 132 disposed over the second organic light emitting layer 720b, and a third functional layer 133 disposed over the third organic light emitting layer 720c. The graded functional layer 130 may have different refractive indexes corresponding to the first to the third organic light emitting layers 720a, 720b and 720c.

The first functional layer 131 may include a first low refractive film 131a disposed over the first organic light emitting layer 720a and first high refractive film 131b disposed on the first low refractive film 131a. The first high refractive film 131b may have a convex lens shape with an upper region and a lower region.

The second functional layer 132 may include a second low refractive film 132a disposed over the second organic light emitting layer 720b and second high refractive film 132b disposed on the second low refractive film 132a. The second high refractive film 132b may have a convex lens shape with an upper region and a lower region.

The third functional layer 133 may include a third low refractive film 133a disposed over the third organic light emitting layer 720c and third high refractive film 133b disposed on the third low refractive film 133a. The third high refractive film 133b may have a convex lens shape with an upper region and a lower region.

In exemplary embodiments, the first to the third low refractive films 131a, 132a, and 133a may include substantially the same materials. Alternatively, the first to the third low refractive films 131a, 132a, and 133a may include a material different from each other.

In exemplary embodiments, the first to the third high refractive films 131b, 132b, and 133b may include substantially the same materials. Alternatively, the first to the third high refractive films 131b, 132b, and 133b may include a material different from that of the remaining first to third high refractive films 131b, 132b, and 133b.

The first to the third low refractive films 131a, 132a, and 133a may be patterned to have concave shapes. The shapes of the concave patterns decide the shape of the lower regions of the first to the third high refractive films 131b, 132b, and 133b successively formed on the first to the third low refractive films 131a, 132a, and 133a.

Each of the upper regions of the first and the second high refractive films 131b and 132b may have a refractive index different from that of the upper region of the third high refractive film. A taper angle between end portions of the upper regions of the first and the second high refractive films 131b and 132b and the color filter layer 150 may be between about 5 degrees and about 20 degrees. In this case, the taper angle between end portion of the upper region of the first high refractive films 131b and the color filter layer 150 may be measured based on a region where a radius of curvature of the first high refractive films 131b is started, and the taper angle between end portion of the upper region of the second high refractive film 132b and the color filter layer 150 may be measured based on a region where a radius of curvature of the second high refractive film 132b is started. A taper angle between an end portion of the upper region of the third refractive film 133b and the color filter layer 150 may be between about 5 degrees and about 15 degrees. In this case, the taper angle between an end portion of the upper region of the third refractive film 133b and the color filter layer 150 may be measured based on a region where a radius of curvature of the third refractive film 133b is started. Since, the way of measuring the taper angle of the first functional layer 131 is substantially the same as those of the second and the third functional layers 132 and 133, duplicated descriptions will be omitted below.

Each of the upper regions of the first and the second high refractive films 131b and 132b may have a width different from that of the upper region of the third high refractive film. The width of the upper regions of the first and the second high refractive films 131b and 132b may be between about 2 μm and about 8 μm. In this case, the width of the upper regions of the first and the second high refractive films 131b and 132b may be measured from a region where radius of curvatures of the first and the second high refractive films 131b and 132b are started to a region where radius of curvatures of the first and the second high refractive films 131b and 132b are ended. The width of the upper region of the third refractive film 133b may be between about 14 μm and about 20 μm. In this case, the width between an end portion of the upper region of the third refractive film 133b and the color filter layer 150 may be measured from a region where radius of curvature of the third refractive film 133b is started to a region where radius of curvature of the third refractive film 133b is ended. Since, the way of measuring the width of the first functional layer 131 is substantially the same as those of the second and the third functional layers 132 and 133, duplicated descriptions will be omitted below.

Alternatively, the each of the upper regions of the first and the second high refractive films 131b and 132b may have substantially the same height as the upper region of the third high refractive film 133b. The height of the upper region of the first to the third high refractive films 131b, 132b and 133b may be between about 0.9 μm and about 2.1 μm.

The lower region of the third high refractive film 133b may have a flat surface. The lower region of the third high refractive film 133b may have a refractive index different from that of the lower regions of the first and the second high refractive films 131b and 132b. In exemplary embodiments, a taper angle between an end portion of the lower region of the third high refractive films 133b and the third low refractive film 133a may be between about 20 degrees and about 70 degrees, and a taper angle between an end portion of the lower region of the first high refractive film 131b and the first low refractive film 131a may be between about 25 degrees and about 80 degrees. Furthermore, a taper angle between an end portion of the lower region of the second high refractive film 132b and the second low refractive film 132a may be between about 25 degrees and about 80 degrees.

The lower region of the third high refractive film 133b may have a width different from that of the lower region of the first and the second high refractive films 131b and 132b. In this case, the width of the lower region of the third high refractive film 133b may be between about 17 μm and about 23 μm.

The lower region of the third high refractive film 133b may have a height different from that of the lower region of the first and the second high refractive films 131b and 132b. The width of the lower region of the third high refractive film 133b may be between about 2.5 µm and about 3.5 µm. The widths of the lower regions of the first and the second high refractive films 131b and 132b may be between about 3 µm and about 4 µm.

However, the present inventive concept is not limited thereto. For example, shapes (i.e., a taper angle, a width, a height, etc) of the first to third low refractive films 131a, 132a and 133a and the shapes of the first to the third high refractive films 131b, 132b and 133b may be changed according to exemplary embodiments of the present invention.

Therefore, the organic light emitting display device 100 according to exemplary embodiments may include the graded functional layer 130. In this case, the graded functional layer 130 may include at least one of the low refractive films and the high refractive films. Accordingly, light generated from the organic light emitting element of the organic light emitting display device 100 may be effectively amplified due to difference of refractive index between the low refractive film and the high refractive film. Thus, the organic light emitting display device 100 may have an improved optical efficiency. In this case, the organic light emitting display device 100 may prevent a color shift in which the light generated from the organic light emitting element may be scattered due to the shape of the low refractive films and the high refractive films.

The black matrix 140 may be disposed on the graded functional layer 130. In exemplary embodiments, the black matrix 140 may be disposed on the graded functional layer 130 corresponding to the peripheral region II. Accordingly, the black matrix 140 may perform as a light-blocking layer. For example, the black matrix 140 may include black silicon and carbon black.

The color filter layer 150 may be disposed on the first to third high refractive films 131b, 132b, and 133b and the black matrix 140. In exemplary embodiments, the color filter layer 150 may include a first color filter layer 150a, a second color filter layer 150b, and a third color filter layer 150c. In this case, the first color filter layer 150a may correspond to a red colored filter layer. The second color filter layer 150b may correspond to a green colored filter layer, and the third color filter layer 150c may correspond to a blue colored filter layer.

Therefore, the organic light emitting display device 100 according to exemplary embodiments may include the black matrix 140 and the color filter layer 150. Accordingly, the organic light emitting display device 100 may have an improved contrast. Furthermore, the organic light emitting display device 100 may further include the graded functional layer 130 with at least one of the low refractive films and the high refractive films so that light generated from the organic light emitting element may be effectively amplified due to difference of refractive index between the low refractive film and the high refractive film. Thus, the organic light emitting display device 100 may have an improved optical efficiency. In this case, the organic light emitting display device 100 may prevent a color shift in which the light generated from the organic light emitting element may be scattered due to the shape of the low refractive films and the high refractive films.

The color filter layer may be omitted when using organic light emitting layer emitting different primary colored lights.

FIGS. 2 to 7 are diagrams illustrating a method of manufacturing the organic light emitting display device in accordance with embodiments. FIGS. 2 to 7 show a method of manufacturing an organic light emitting display device of FIG. 1, however, these may not be limited thereto.

Figure 2:
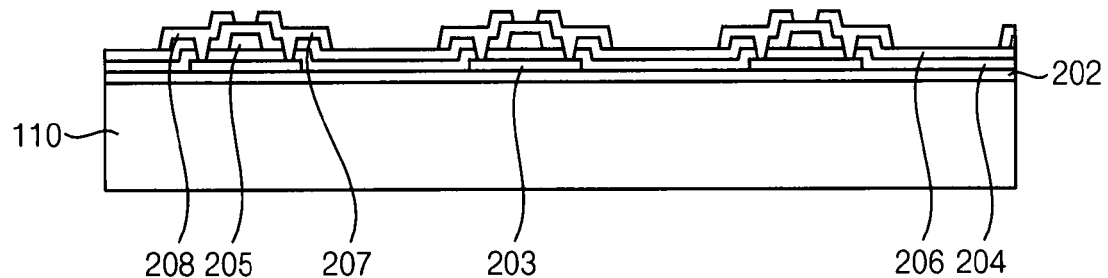
FIGS. 2 to 7 are diagrams illustrating a method of manufacturing the organic light emitting display device in accordance with embodiments of the present invention.

Referring to FIG. 2, a buffer layer 202 may be formed on a substrate 110. The substrate 110 may include a glass substrate, a quartz substrate, a transparent resin substrate, etc. Examples of the transparent resin substrate for the substrate 110 may include polyimide-based resin, acryl-based resin, polyacrylate-based resin, polycarbonate-based resin, polyether-based resin, sulfonic acid-containing resin, polyethyleneterephthalate-based resin, etc.

The buffer layer 202 may prevent diffusion of metal atoms and/or impurities from the substrate 110 to a thin film transistor or an organic light emitting device. Additionally, the buffer layer 202 may adjust heat transfer rate of a successive crystallization process for an active pattern 203, to thereby obtaining a substantially uniform active pattern 203. In case that the substrate 110 may have a relatively irregular surface, the buffer layer 202 may improve flatness of the surface of the substrate 110. The buffer layer 202 may be formed using a silicon compound. For example, the buffer layer 202 may include silicon oxide, silicon nitride, silicon oxynitride, silicon oxycarbide, silicon carbon nitride, etc. These may be used alone or in any combination thereof. The buffer layer 202 may be formed by a sputtering process, a chemical vapor deposition (CVD) process such as a plasma enhanced chemical vapor deposition (PECVD), a high density plasma-chemical vapor deposition (HDP-CVD) process, etc. Additionally, the buffer layer 202 may have a single layer structure or a multi layer structure. For example, the buffer layer 202 may have a single layer structure including a silicon oxide film, a silicon nitride film, a silicon oxynitride film, a silicon oxycarbide film, or a silicon carbon nitride film. Alternatively, the buffer layer 202 may be a multi layer structure including at least two of a silicon oxide film, a silicon nitride film, a silicon oxynitride film, a silicon oxycarbide film, a silicon carbon nitride film, etc.

In exemplary embodiments, a semiconductor layer may be formed on the buffer layer 202. A preliminary semiconductor layer pattern may be formed on the buffer layer 202 by patterning the semiconductor layer. The crystallization process may be executed on the preliminary semiconductor layer pattern to form the active pattern 203 on the buffer layer 202. The semiconductor layer may be formed by a sputtering process or a CVD process such as a PECVD process, a low pressure chemical vapor deposition (LPCVD), etc. When the semiconductor layer includes amorphous silicon, the active pattern 203 may include polysilicon. The crystallization process for forming the active pattern 203 may include a laser irradiation process, a thermal treatment process, a thermal process utilizing a catalyst, etc.

Referring now to FIG. 2, the gate insulating layer 203 may be disposed on the buffer layer 202 to cover the active pattern 203. The gate insulating layer 203 may be formed by a CVD process such as a PECVD process, a HDP-CVD process, etc., a spin coating process, a sputtering process, a vacuum evaporation process, a printing process, etc. The gate insulating layer 203 may include silicon oxide, metal oxide, etc. Examples of metal oxide in the gate insulating layer 203 may include hafnium oxide (HfOx), aluminum oxide (AlOx), zirconium oxide (ZrOx), titanium oxide (TiOx), tantalum oxide (TaOx), etc. These may be used alone or in any combination thereof.

The gate electrode 205 may be formed on the gate insulating layer 205. In exemplary embodiments, the gate electrode 205 may be positioned on a portion of the gate insulating layer 205 under which the active pattern 203 is located.

In exemplary embodiments, a first conductive layer may be formed on the gate insulating layer 205. The first conductive layer may be patterned by etching the first conductive layer by a conventional photo-etching process. Hence, the gate electrode 205 may be provided on the gate insulating layer 205.

The first conductive layer may be formed by a printing process, a sputtering process, a CVD process, a pulsed laser deposition (PLD) process, a vacuum evaporation process, an ALD process, etc. The gate electrode 205 may include metal, alloy, conductive metal oxide, a transparent conductive material, etc. For example, the gate electrode 205 may be formed using aluminum (Al), alloy containing aluminum, aluminum nitride (AlNx), silver (Ag), alloy containing silver, tungsten (W), tungsten nitride (WNx), copper (Cu), alloy containing copper, nickel (Ni), alloy containing nickel, chrome (Cr), chrome nitride (CrNx), molybdenum (Mo), alloy containing molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), indium tin oxide (ITO), tin oxide (SnOx), indium oxide (InOx), gallium oxide (GaOx), indium zinc oxide (IZO), etc. These may be used alone or in any combination thereof. In exemplary embodiments, the gate electrode 205 may have a single layer structure or a multi layer structure, which may include a metal film, an alloy film, a metal nitride film, a conductive metal oxide film, and/or a transparent conductive film. Additionally, the gate electrode 205 may have a single layer structure or a multi layer structure, which may include a conductive material, a heat resistance material and/or a transparent conductive material.

In exemplary embodiments, a gate line may be formed on the gate insulating layer 205 while forming the gate electrode 205 on the gate insulating layer 205. The gate line may be coupled to the gate electrode 205, and the gate line may extend on the gate insulating layer 205 along a first direction.

Using the gate electrode 205 as a mask, impurities may be implanted into portions of the active pattern 203, such that a source region and a drain region may be formed in the active pattern 203. A central portion of the active pattern 203 may correspond to a channel region between the source and the drain regions because the impurities may not be doped into the central portion of the active pattern 203.

An insulating interlayer 206 may be disposed on the gate insulation layer 204 to cover the gate electrode 205. The insulating interlayer 206 may be conformally formed on the gate insulation layer 204 along a profile of the gate electrode 205. The insulating interlayer 206 may be formed using a silicon compound. For example, the insulating interlayer 206 may include silicon oxide, silicon nitride, silicon oxynitride, silicon oxycarbide and/or silicon carbon nitride. These may be used alone or in any combination thereof. The insulating interlayer 206 may be formed by a spin coating process, a CVD process such as a PECVD process, a HDP-CVD process, etc. The insulating interlayer 206 may electrically insulate the source and the drain electrodes 207 and 208 from the gate electrode 205.

As illustrated in FIG. 2, the source electrode 207 and the drain electrode 208 may be disposed on the insulating interlayer 206. The source and the drain electrodes 207 and 208 may be separated from each other by a predetermined distance and have a gate electrode 205 therebetween. The source and the drain electrodes 207 and 208 may pass through the insulating interlayer 206, and may make contact with the source and the drain regions of the active pattern 203, respectively.

In exemplary embodiments, the insulating interlayer 206 may be etched to form contact holes exposing the source and the drain regions, respectively. A second conductive layer may be formed on the insulating interlayer 206 to fill the contact holes. The second conductive layer may be patterned using a conventional photo-etching process to form the source and the drain electrodes 207 and 208 on the source and the drain regions, respectively. The second conductive layer may be formed by a sputtering process, a CVD process, a PLD process, a vacuum deposition process, an ALD process, a printing process. Each of the source and the drain electrodes 207 and 208 may include metal, alloy, metal nitride, conductive metal oxide, a transparent conductive material, etc. For example, the source and the drain electrodes 207 and 208 may be formed using aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in any combination thereof.

In exemplary embodiments, a data line may be formed on the insulating layer 206 while forming the source and the drain electrodes 207 and 208. The data line may extend on the insulating layer 206 along a second direction. Here, the second direction may be substantially perpendicular to the first direction where the gate line may extend. The data line may make contact with the source electrode 207.

When forming the source and the drain electrodes 207 and 208 on the insulating interlayer 206, the switching device may be formed at the same time on the substrate 110. The switching device may include the TFT that may have the active pattern 203, the gate insulation layer 204, the gate electrode 205, the source electrode 207, and the drain electrode 208.

Figure 3:
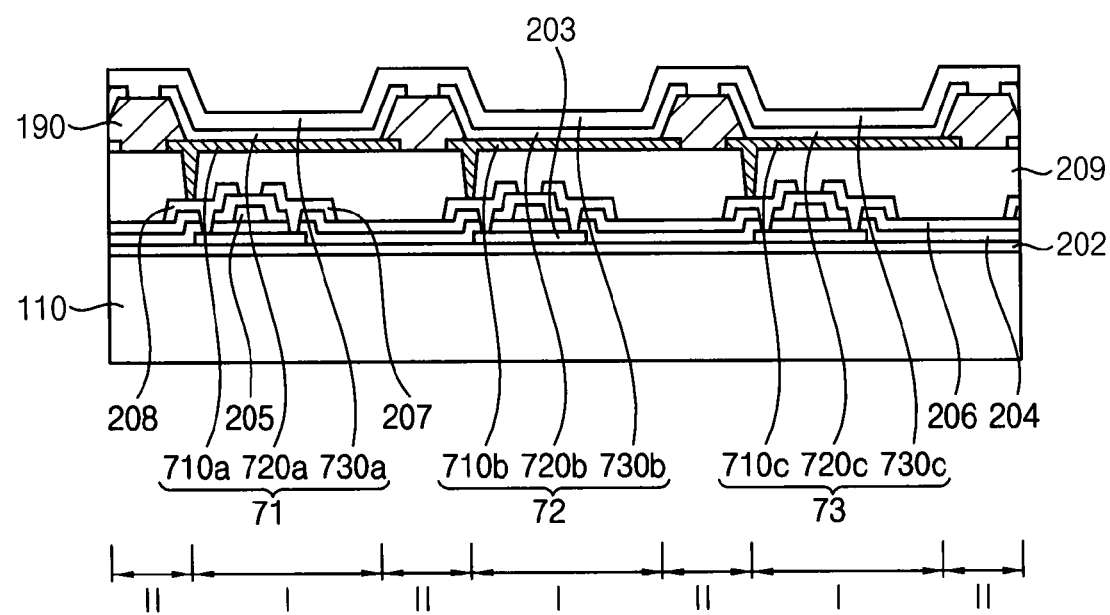

Referring to FIG. 3, an insulation layer 209 may be disposed on the insulating interlayer 206 to cover the source and drain electrodes 207 and 208. The insulation layer 209 may have a thickness sufficiently covering the source and the drain electrodes 207 and 208. The insulation layer 209 may include an organic material or an inorganic material. For example, the insulation layer 209 may be formed using photoresist, acryl-based resin, polyimide-based resin, polyamide-based resin, siloxane-based resin, resin containing photosensitive carboxyl group, novolak resin, alkali-developable resin, silicon oxide, silicon nitride, silicon oxynitride, silicon oxycarbide, silicon carbon nitride, etc. These may be used alone or in any combination thereof. The insulation layer 209 may be formed by a spin coating process, a printing process, a sputtering process, a CVD process such as a PECVD, a HDP-CVD process, etc., an ALD process, a vacuum evaporation process, etc.

The insulation layer 209 may be partially etched by a conventional photo-etching process and thus a contact hole may be formed through the insulation layer 209. The contact hole may expose the drain electrode 208 of the switching device.

The first electrodes 710a, 710b and 710c may be disposed on the insulation layer 209 to fill the contact hole. Thus, each of the first electrodes 710a, 710b and 710c may make contact with the drain electrode 208 exposed by the contact hole. Alternatively, a contact, a plug, or a pad may be formed in the contact hole, and then the first electrode 710a, 710b and 710c may be formed on the contact, the plug, or the pad. For example, the first electrodes 710a, 710b and 710c may be electrically connected to the drain electrode 208 through the contact, the plug, or the pad.

The first electrode 710 may include a reflective material or a transparent material in accordance with the emission type of the organic light emitting display device. In exemplary embodiments, when the first electrodes 710a, 710b and 710c includes the transparent material, the first electrodes 710a, 710b and 710c may be formed using indium zinc oxide, indium tin oxide, gallium tin oxide, zinc oxide, gallium oxide, tin oxide, indium oxide, mixtures thereof. Alternatively, when the first electrodes 710a, 710b and 710c includes the reflective material, the first electrodes 710a, 710b and 710c may be formed using aluminum, silver, platinum, chrome, tungsten, molybdenum, palladium, alloys thereof. The first electrodes 710a, 710b and 710c may be formed by a printing process, a sputtering process, a CVD process, an ALD process, a PLD process, etc.

A pixel defining layer 190 may be disposed on the first electrodes 710a, 710b and 710c. The pixel defining layer 190 may include an organic material or an inorganic material. For example, the pixel defining layer 190 may be formed using photoresist, acryl-based resin, polyacryl-based resin, polyimide-based resin, a silicon compound, etc. The pixel defining layer 190 may be formed by a spin coating process, a spray process, a printing process, a CVD process, etc.

In exemplary embodiments, the pixel defining layer 190 may be etched to form an opening exposing the first electrode 710. The opening of the pixel defining layer 190 may define a pixel region I and a peripheral region II of the organic light emitting display device. For example, a portion having the opening of the pixel defining layer 190 may be the pixel region I of the organic light emitting display device while another portion surrounding the opening of the pixel defining layer 190 may be the peripheral region II of the organic light emitting display device.

Referring now to FIG. 3, the first to third organic light emitting display device 71, 72 and 73 may be positioned on a region corresponding to the first electrodes 710a, 710b and 710c exposed by the opening of the pixel defining layer 190. The first to the third organic light emitting display layers 720a, 720b and 720c may extend on a side wall of the opening of the pixel defining layer 190. In exemplary embodiments, the first to the third organic light emitting display device 71, 72 and 73 may include the first to the third organic light emitting layers 720a, 720b and 720c, a hole injection layer, a hole transfer layer, an electron transfer layer, an electron injection layer, etc. In exemplary embodiments, the first to the third organic light emitting display device 71, 72 and 73 may be formed using light emitting materials for generating different colored light such as a red colored light (R), a green colored light (G) and a blue colored light (B) in accordance with color pixels of the organic light emitting display device. Alternatively, the first to the third organic light emitting display device 71, 72 and 73 may include a plurality of stacked light emitting materials for generating a red colored light, a green colored light, and a blue colored light to thereby emitting a white color of light.

A second electrode 730a, 730b and 730c may be formed on the first to the third organic light emitting display device 71, 72 and 73 and the pixel defining layer 190. The second electrode 730 may be formed using zinc oxide, indium tin oxide, tin oxide, indium oxide, gallium oxide, indium zinc oxide, etc. These may be used alone or in any combination thereof. The second electrode 730a, 730b and 730c may be formed by a sputtering process, a CVD process, an ALD process, a PLD process, a printing process, etc.

Figure 4:
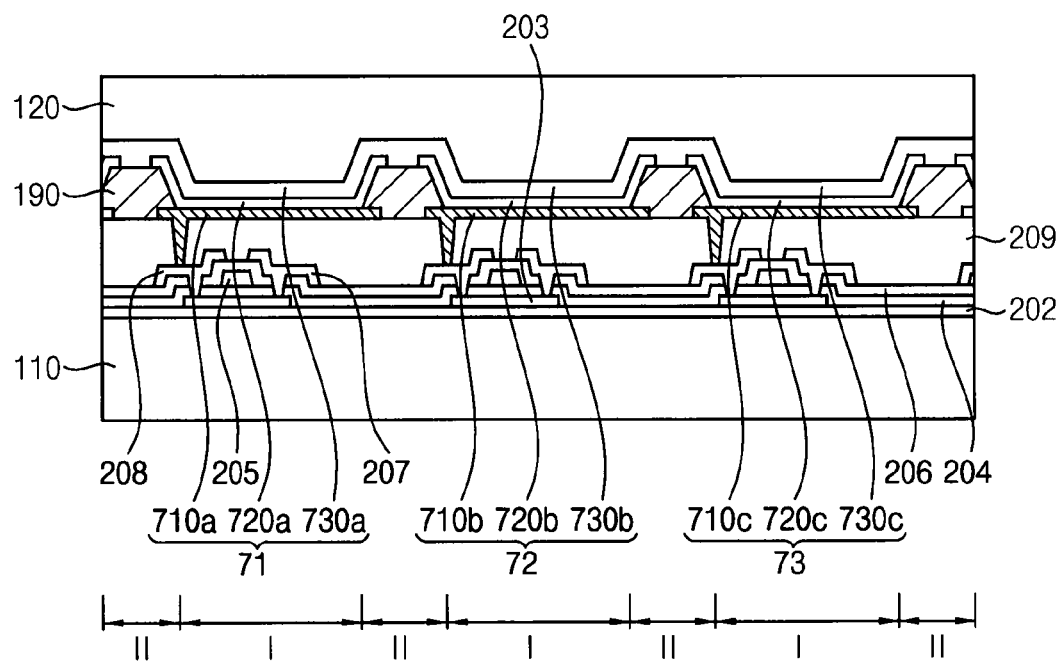

Referring to FIG. 4, an encapsulating member 120 may be formed on the second electrode 730. In exemplary embodiments, the encapsulating member 120 may have a single layer structure or a multi layer structure, which may include an inorganic material and an organic material. The encapsulating member 120 may preferably have a structure in which the inorganic material and then organic material may be stacked alternately and repeatedly. Accordingly, the encapsulating member 120 having stacked structure is suitable for a flexible display device, etc. Alternatively, the encapsulating member 120 may include a transparent insulating substrate. For example, the encapsulating member 120 may include a glass substrate, a quartz substrate, a transparent resin substrate, etc. In this case, a predetermined space may be provided between the second electrode 730 and the encapsulating member 120. This space may be filled with an air or an inactive gas such as a nitrogen ($N_2$) gas.

Figure 5:
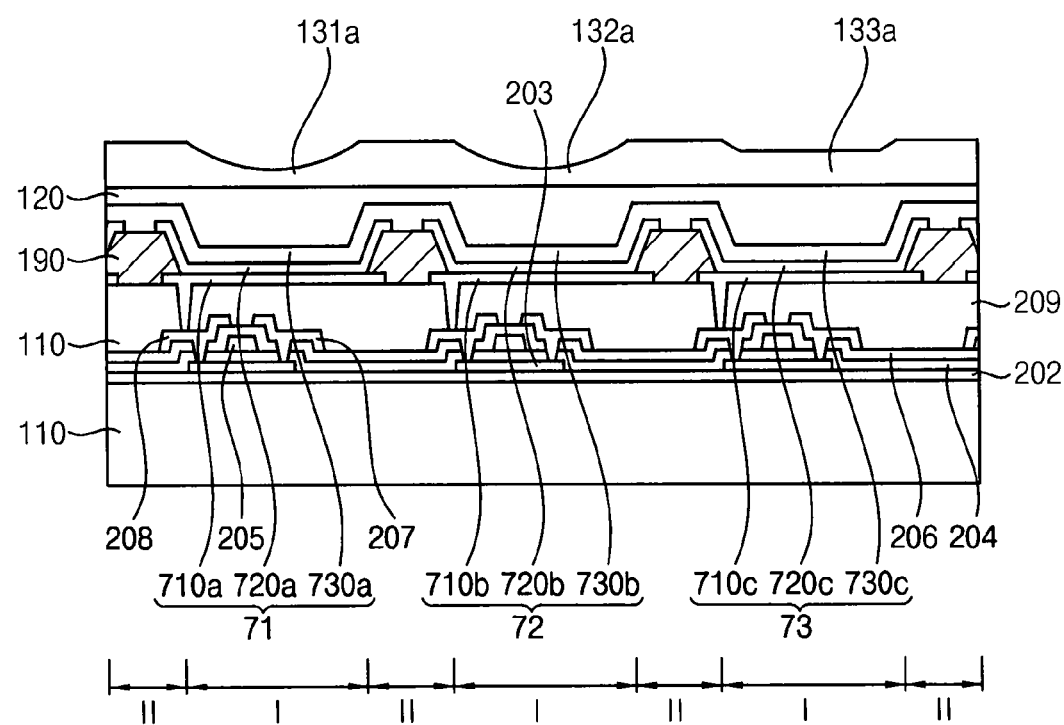

Referring to FIG. 5, the first to the third low refractive films 131a, 132a and 133a may be formed on the encapsulating member 120. The first low refractive film 131a may be positioned over the first organic light emitting layer 720a. The second low refractive film 132a may be positioned over the second organic light emitting layer 720b. The third low refractive film 133a may be positioned over the third organic light emitting layer 720c.

In exemplary embodiments, the first to the third low refractive films 131a, 132a and 133a may be formed on the encapsulating member 120. Thereafter, the first to the third low refractive films 131a, 132a and 133a may be partially removed by a conventional photo-etching process. The shape of the first to the third low refractive films 131a, 132a, and 133a may decide a profile of the lower regions of the first to the third high refractive films 131b, 132b, and 133b (see FIG. 6).

In exemplary embodiments, the first to the third low refractive films 131a, 132a, and 133a may include substantially the same materials. Alternatively, the first to the third low refractive films 131a, 132a, and 133a may be a material different from that of the remaining first to third low refractive films 131a, 132a, and 133a other.

Figure 6:
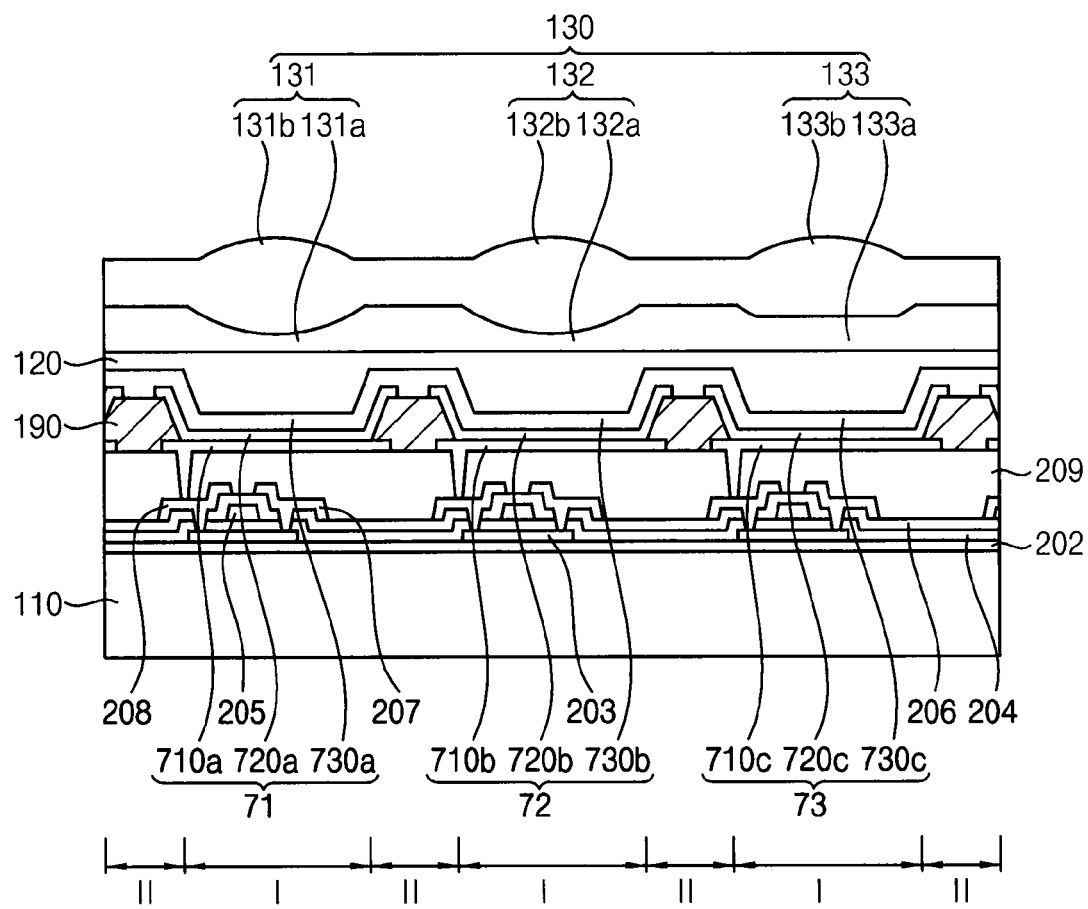

Referring to FIG. 6, the first to the third high refractive films 131b, 132b, and 133b may be formed on the first to the third low refractive films 131a, 132a, and 133a. The first high refractive film 131b may be positioned over the first organic light emitting layer 720a. The second high refractive film 132b may be positioned over the second organic light emitting layer 720b. The third high refractive film 133b may be positioned over the third organic light emitting layer 720c. In exemplary embodiments, the first to the third high refractive films 131b, 132b, and 133b may have a convex lens shape with an upper region and a lower region. For example, each of the upper regions of the first and the second high refractive films 131b and 132b and the upper region of the third high refractive film 133b may be substantially the same height. Alternatively, the each of the upper regions of the first and the second high refractive films 131b and 132b may have a refractive index and a width different from that of the upper region of the third high refractive film 133b.

Alternatively, the lower region of the third high refractive film 133b may have a refractive index, a width, and a height different from those of the lower region of the first and the second high refractive films 131b and 132b due to a shape of the third high refractive film 133b.

In exemplary embodiments, the first to the third high refractive films 131b, 132b and 133b may include substantially the same materials. Alternatively, at least one of the first to the third high refractive films 131b, 132b and 133b may include a material different from that of the remaining first to third high refractive films 131b, 132b and 133.

Figure 7:
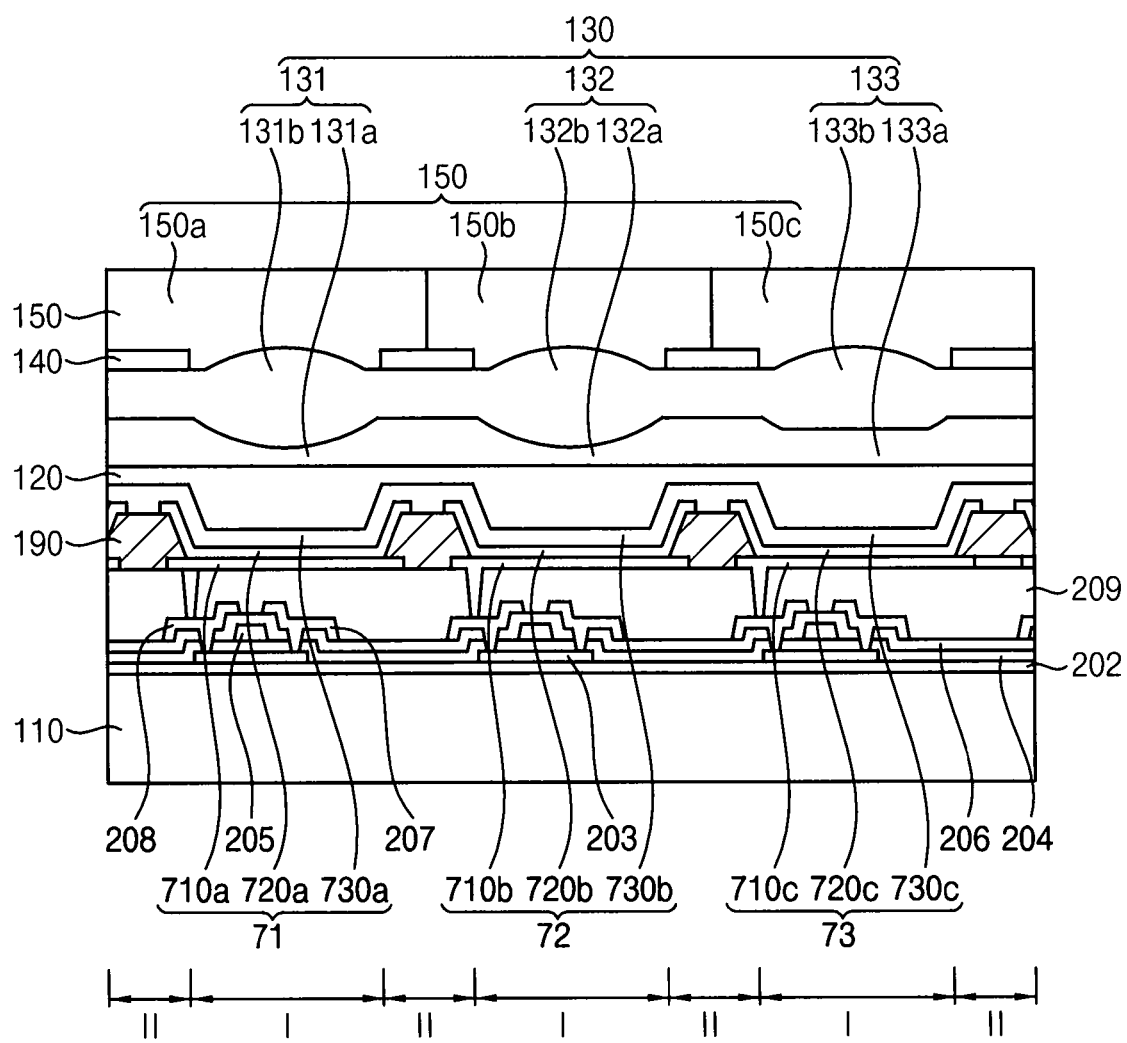

Referring to FIG. 7, a black matrix 140 may be formed on a graded functional layer 130. The black matrix 140 may be disposed on the graded functional layer 130 corresponding to the peripheral region II.

In exemplary embodiments, a black material layer may be formed on the graded functional layer 130. For example, the black material layer may include black silicon, carbon black, etc. Thereafter, the black material layer may be etched using a conventional photo-etching process. Hence, the black matrix 140 may be provided on the graded functional layer 130.

Referring now FIG. 7, a color filter layer 150 may be formed on the black matrix 140. In exemplary embodiments, the color filter layer 150 may include a first color filter layer 150a, a second color filter layer 150b, and a third color filter layer 150c.

In exemplary embodiments, red color, green color and blue color resin layers may be formed on the black matrix 140. Thereafter, red color, green color and blue color resin layers may be patterned by a photolithography process. Hence, the first to the third color filter layers 150a, 150b and 150c may be provided on the black matrix 140. In this case, the first color filter layer 150a may correspond to a red colored filter layer. The second color filter layer 150b may correspond to a green colored filter layer, and the third color filter layer 150c may correspond to a blue colored filter layer.

Figure 8:
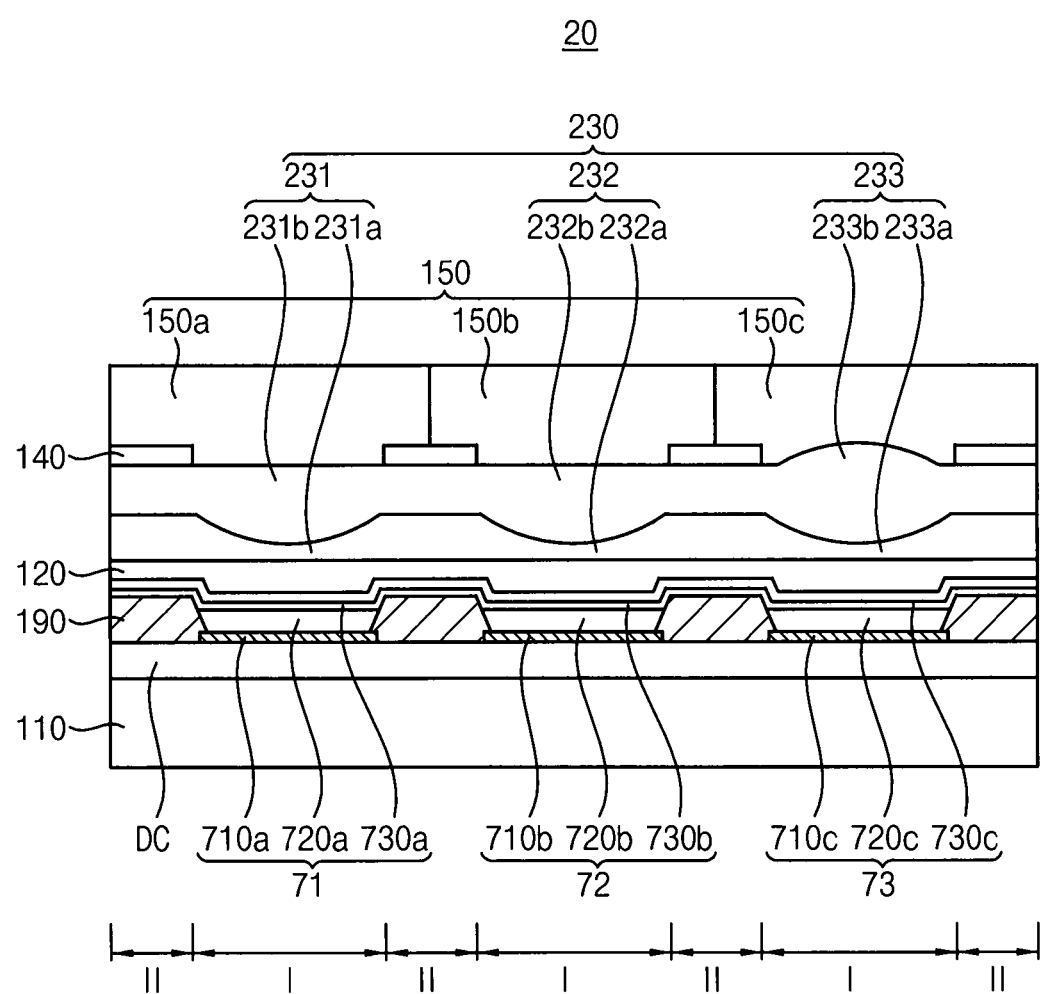
FIG. 8 is a cross-sectional view illustrating an organic light emitting display device in accordance with embodiments of the present invention.

FIG. 8 is a cross-sectional view illustrating an organic light emitting display device in accordance with another embodiment. Since the organic light emitting display device of FIG. 8 has a structure substantially the same as or substantially similar to the organic light emitting display device of FIG. 1 except for a graded functional layer, duplicated descriptions will be omitted below.

Referring to FIG. 8, an organic light emitting display device 100 may include a substrate 110, a driving circuit unit DC, a first organic light emitting element 71, a second organic light emitting element 72, a third organic light emitting element 73, an encapsulating member 120, a graded functional layer 230, a black matrix 140, a color filter layer 150, etc. Hereinafter only the graded functional layer 230 will be illustrated for the convenience of explanation.

The graded functional layer 230 may have a first functional layer 231 disposed over the first organic light emitting layer 720a, a second functional layer 232 disposed over the second organic light emitting layer 720b, and a third functional layer 233 disposed over the third organic light emitting layer 720c. The first to the third functional layer 231, 232 and 233 may have different refractive indexes according to the first to the third organic light emitting layers 720a, 720b and 720c.

The first functional layer 231 may include a first low refractive film 231a disposed over the first organic light emitting layer 720a and first high refractive film 231b disposed on the first low refractive film 231a. The first high refractive film 231b may have a convex lens shape with an upper region and a lower region.

The second functional layer 232 may include a second low refractive film 232a disposed over the second organic light emitting layer 720b and second high refractive film 232b disposed on the second low refractive film 232a. The second high refractive film 232b may have a convex lens shape with an upper region and a lower region.

The third functional layer 233 may include a third low refractive film 233a disposed over the third organic light emitting layer 720c and third high refractive film 233b disposed on the third low refractive film 233a. In this case, the third high refractive film 233b may have a convex lens shape with an upper region and a lower region.

The first to the third low refractive films 231a, 232a, and 233a may decide a profile of the lower regions of the first to the third high refractive films 231b, 232b, and 233b. In exemplary embodiments, the first to the third low refractive films 231a, 232a, and 233a may include substantially the same materials. Additionally, the first to the third high refractive films 231b, 232b, and 233b may include substantially the same materials In exemplary embodiments, each of the upper regions of the first and the second high refractive films 231b and 232b may be flat. In this case, each of the upper regions of the first and the second high refractive films 231b and 232b may have a refractive index and a height different from those of the upper region of the third high refractive film 233b. For example, a taper angle between an end portion of the upper region of the third high refractive film 233b and the color filter layer 150 may be between about 5 degrees and about 15 degrees, and a height of the upper region of the third high refractive film 233b may be between about 1.9 μm and about 2.1 μm.

Each of the upper regions of the first and the second high refractive films 231b and 232b may have a width different from that of the upper region of third high refractive film 233b. In this case, the each of the widths of the upper regions of the first and the second high refractive films 231b and 232b may be between about 7 μm and about 13 μm, and the width of the upper region of the third refractive film 233b may be between about 14 μm and about 20 μm.

Each of the lower regions of the first and the second high refractive films 231b and 232b may have a refractive index different from that of the upper region of the third high refractive film 233b. For example, a taper angle between an end portion of the lower region of the first and the second high refractive films 231b and 232b and the first and the second low refractive film 231a and 232a may be between about 25 degrees and about 80 degrees, and a taper angle between an end portion of the lower region of the third high refractive film 233b and the third low refractive film 233a may be between about 20 degrees and about 70 degrees.

Each of the lower regions of the first and the second high refractive films 231b and 232b may have a width different from that of the lower region of the third high refractive film 233b. In this case, the width of the lower region of the first and the second high refractive films 231b and 232b may be between about 7 μm and about 13 μm, and the width of the lower region of the third refractive film 233b may be between about 17 μm and about 23 μm.

Each of the lower regions of the first and the second high refractive films 231b and 232b may have a height different from that of the lower region of the third high refractive film 233b. In this case, the height of the lower region of the first and the second high refractive films 231b and 232b may be between about 2.5 μm and about 3.5 μm, and the height of the lower region of the third refractive film 233b may be between about 2 μm and about 4 μm.

However, the present inventive concept is not limited thereto. For example, shapes (i.e., a taper angle, a width, a height, etc) of the first to the third low refractive films 231a, 232a and 233a and the shapes of the first to the third high refractive films 231b, 232b and 233b may be changed according to exemplary embodiments of the present invention.

Figure 9:
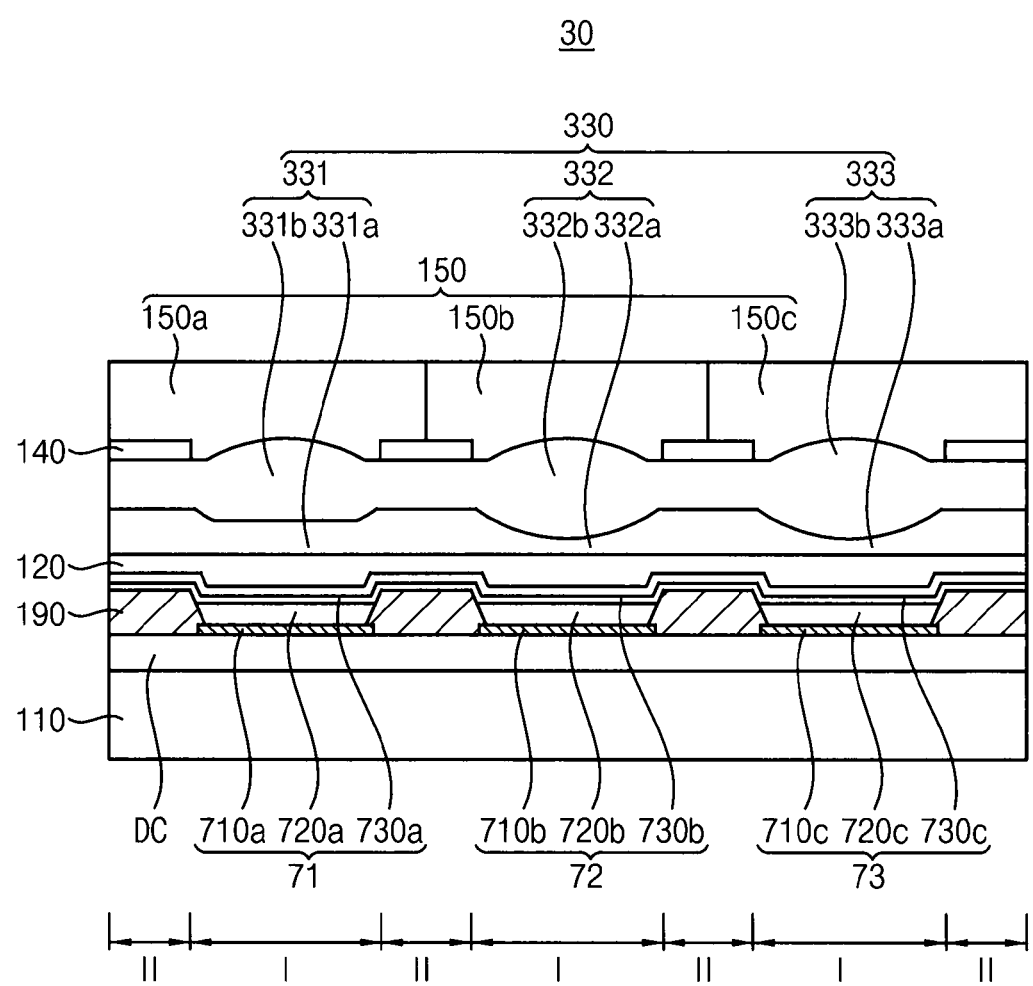
FIG. 9 is a cross-sectional view illustrating an organic light emitting display device in accordance with embodiments of the present invention.

FIG. 9 is a cross-sectional view illustrating an organic light emitting display device in accordance with another embodiment. Since the organic light emitting display device of FIG. 9 has a structure substantially the same as or substantially similar to the organic light emitting display device of FIG. 1 except for a graded functional layer, duplicated descriptions will be omitted below.

Referring to FIG. 9, an organic light emitting display device 100 may include a substrate 110, a driving circuit unit DC, a first organic light emitting element 71, a second organic light emitting element 72, a third organic light emitting element 73, an encapsulating member 120, a graded functional layer 330, a black matrix 140, a color filter layer 150, etc. Hereinafter only the graded functional layer 330 will be illustrated for the convenience of explanation.

The graded functional layer 330 may have a first functional layer 331 disposed over the first organic light emitting layer 720a, a second functional layer 332 disposed over the second organic light emitting layer 720b, and a third functional layer 333 disposed over the third organic light emitting layer 720c. In this case, the first to the third functional layer 331, 332 and 333 may have different refractive indexes corresponding to the first to the third organic light emitting layers 720a, 720b and 720c.

The first functional layer 331 may include a first low refractive film 331a disposed over the first organic light emitting layer 720a and the first high refractive film 331b disposed on the first low refractive film 331a. In this case, the first high refractive film 331b may have a convex lens shape with an upper region and a lower region.

The second functional layer 332 may include a second low refractive film 332a disposed over the second organic light emitting layer 720b and the second high refractive film 332b disposed on the second low refractive film 332a. In this case, the second high refractive film 332b may have a convex lens shape with an upper region and a lower region.

The third functional layer 333 may include a third low refractive film 333a disposed over the third organic light emitting layer 720c and the third high refractive film 333b disposed on the third low refractive film 333a. In this case, the third high refractive film 333b may have a convex lens shape with an upper region and a lower region.

The first to the third low refractive films 331a, 332a, and 333a may decide a profile of the lower regions of the first to the third high refractive films 331b, 332b, and 333b. In exemplary embodiments, the first to the third low refractive films 331a, 332a, and 333a may include substantially the same materials. Additionally, the first to the third high refractive films 331b, 332b, and 333b may include substantially the same materials In exemplary embodiments, the lower region of the first and the second high refractive films 331b and 331b may be flat. In this case, the lower region of the first high refractive film 331b may have substantially the same refractive index as the lower region of the second high refractive film 332b. The lower region of the first high refractive film 331b may have a refractive index different from that of the lower region of the third high refractive film 333b. For example, a taper angle between end portion of the lower region of the first and second high refractive films 331b and 331b and the first low refractive film 331a may be between about 25 degrees and about 80 degrees, and a taper angle between end portion of the lower region of the third high refractive film 333b and the third low refractive film 333a may be between about 20 degrees and about 70 degrees.

The lower region of the first high refractive film 331b may have substantially the same width as the lower region of the second high refractive film 332b. The lower region of the first high refractive film 331b may have a width different from that of the lower region of the third high refractive film 333b. For example, the width of the lower region of the first and the second high refractive films 331b and 332b may be between about 7 μm and about 13 μm. A flat portion of the lower region of the first high refractive film 331b may be between about 3 μm and about 7 μm, and the width of the lower region of the third refractive film 333b may be between about 17 μm and about 23 μm.

Each of the lower regions of the first high refractive film 331b may have a height different from that of the lower region of the second and the third high refractive films 332b and 333b. In this case, the height of the lower region of the first high refractive film 331b may be between about 2.5 μm and about 3.5 μm, and the height of the lower region of the second and the third refractive films 332b and 333b may be between about 3 μm and about 4 μm.

The upper region of the first high refractive film 331b may have substantially the same refractive index as the upper region of the second high refractive film 332b. The lower region of the first high refractive film 331b may have a refractive index different from that of the upper region of the third high refractive film 333b. For example, a taper angle between an end portion of the upper region of the first and the second high refractive films 331b and 332b and the color filter layer 150 may be between about 5 degrees and about 20 degrees, and a taper angle between an end portion of the upper region of the third high refractive film 333b and the color filter layer 150 may be between about 5 degrees and about 15 degrees.

Each of the upper regions of the first and the second high refractive films 331b and 332b may have a width different from that of the upper region of the third high refractive film 333b. In this case, the width of the upper region of the first and the second high refractive films 331b and 332b may be between about 2 μm and about 8 μm, and the width of the upper region of the third refractive film 333b may be between about 14 μm and about 20 μm.

Each of the upper regions of the first and the second high refractive films 331b and 332b may have substantially the same height as the upper region of the third high refractive film 333b. In this case, the height of the upper region of the first to the third high refractive films 331b, 332b and 333b may be between about 0.9 μm and about 2.1 μm.

However, the present inventive concept is not limited thereto. For example, shapes (i.e., a taper angle, a width, a height, etc) of the first to the third low refractive films 331a, 332a and 333a and the shapes of the first to the third high refractive films 331b, 332b and 333b may be changed according to exemplary embodiments of the present invention.

Figure 10:
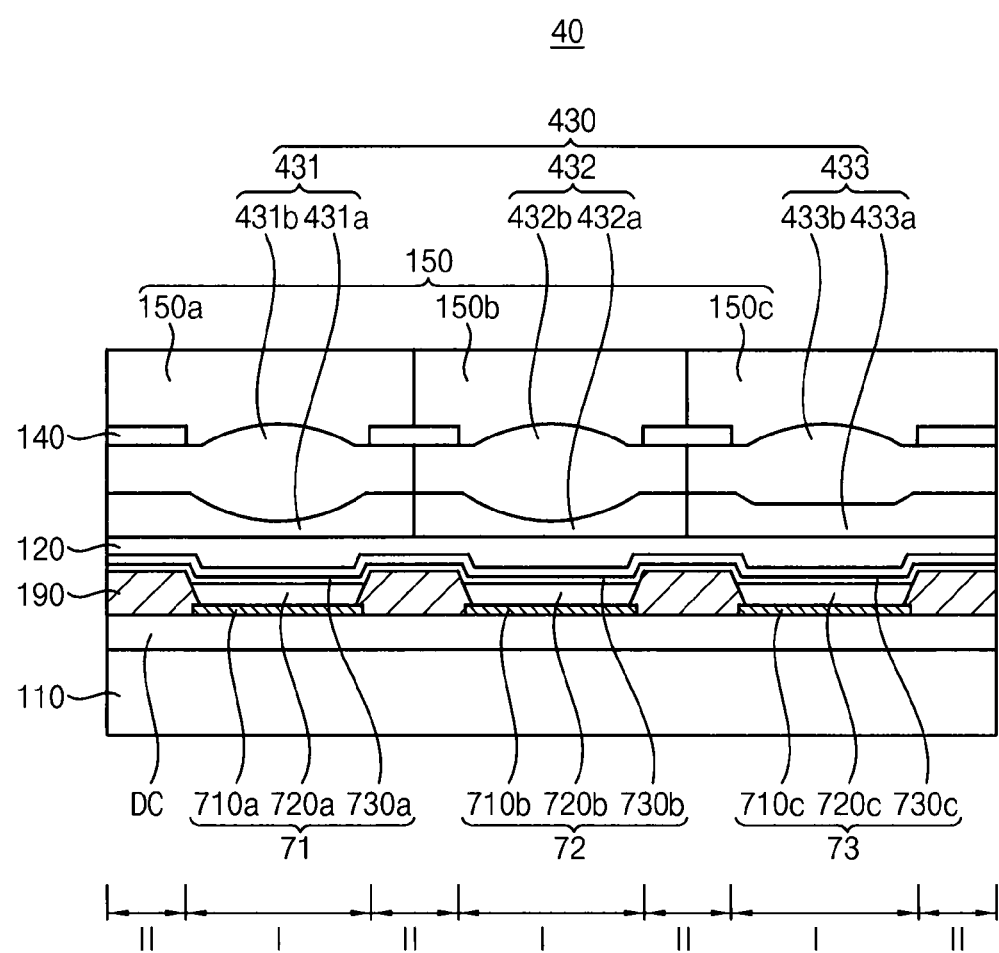
FIG. 10 is a cross-sectional view illustrating an organic light emitting display device in accordance with embodiments of the present invention.

FIG. 10 is a cross-sectional view illustrating an organic light emitting display device in accordance with embodiments. Since the organic light emitting display device of FIG. 10 has a structure substantially the same as or substantially similar to the organic light emitting display device of FIG. 1 except for a graded functional layer, duplicated descriptions will be omitted below.

Referring to FIG. 10, an organic light emitting display device may include a substrate 110, a driving circuit unit DC, a first organic light emitting element 71, a second organic light emitting element 72, a third organic light emitting element 73, an encapsulating member 120, a graded functional layer 430, a black matrix 140, a color filter layer 150, etc. Hereinafter only the graded functional layer 430 will be illustrated for the convenience of explanation.

The graded functional layer 430 may have a first functional layer 431 disposed over the first organic light emitting layer 720a, a second functional layer 432 disposed over the second organic light emitting layer 720b, and a third functional layer 433 disposed over the third organic light emitting layer 720c. In this case, the first to the third functional layer 431, 432 and 433 may have different refractive indexes corresponding to the first to the third organic light emitting layers 720a, 720b and 720c.

The first functional layer 431 may include a first low refractive film 431a disposed over the first organic light emitting layer 720a and first high refractive film 431b disposed on the first low refractive film 431a. In this case, the first high refractive film 431b may have a convex lens shape with an upper region and a lower region.

The second functional layer 432 may include a second low refractive film 432a disposed over the second organic light emitting layer 720b and second high refractive film 432b disposed on the second low refractive film 432a. In this case, the second high refractive film 432b may have a convex lens shape with an upper region and a lower region.

The third functional layer 433 may include a third low refractive film 433a disposed over the third organic light emitting layer 720c and third high refractive film 433b disposed on the third low refractive film 433a. In this case, the third high refractive film 433b may have a convex lens shape with an upper region and a lower region.

The first to the third low refractive films 431a, 432a, and 433a may decide a profile of the lower regions of the first to the third high refractive films 431b, 432b, and 433b. In exemplary embodiments, the first to the third low refractive films 431a, 432a, and 433a may include a material different from that of the remaining first to third high refractive films 431a, 432a, and 433a. Additionally, the first to third high refractive films 431b, 432b, and 433b may include a material different from that of the remaining first to third high refractive films 431b, 432b, and 433b.

Figure 11:
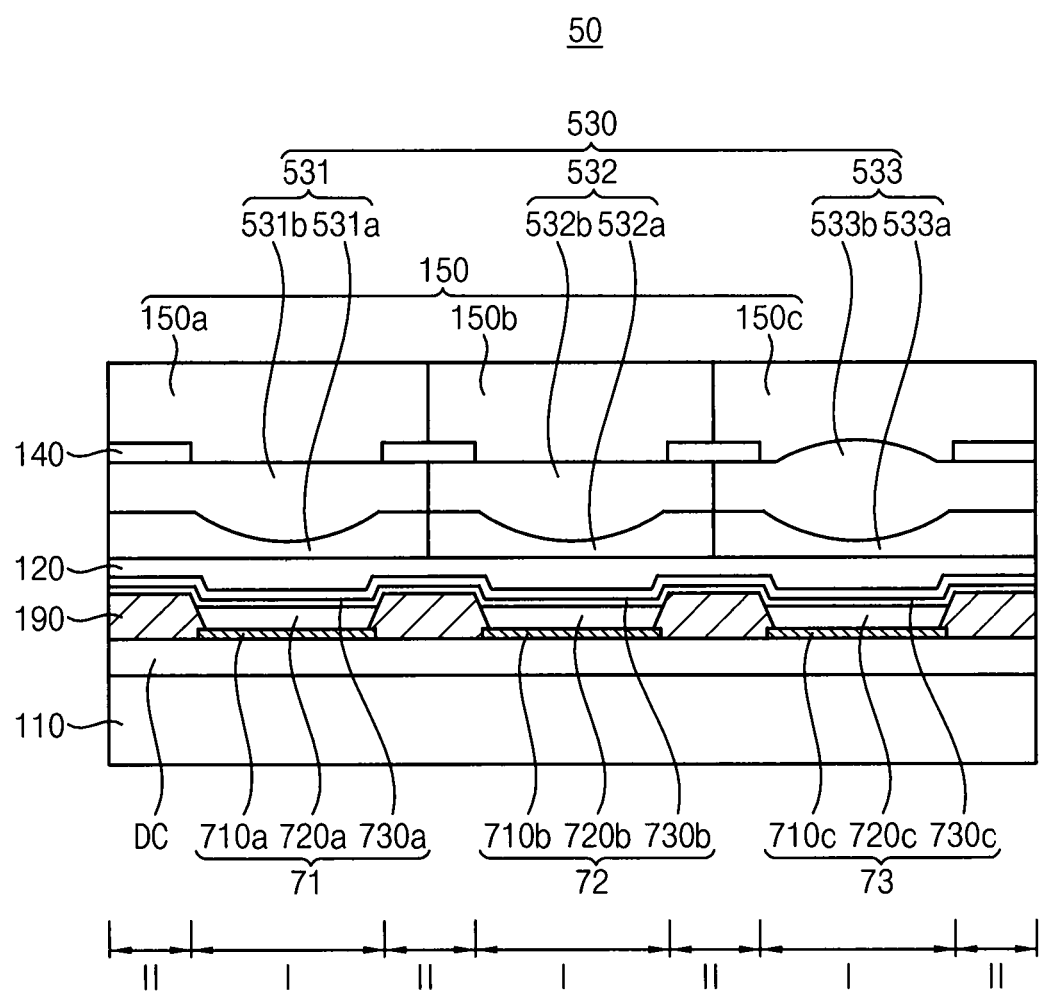
FIG. 11 is a cross-sectional view illustrating an organic light emitting display device in accordance with embodiments.

FIG. 11 is a cross-sectional view illustrating an organic light emitting display device in accordance with another embodiment.

Referring to FIG. 11, an organic light emitting display device may include a substrate 110, a driving circuit unit DC, a first organic light emitting element 71, a second organic light emitting element 72, a third organic light emitting element 73, an encapsulating member 120, a graded functional layer 530, a black matrix 140, a color filter layer 150, etc. Hereinafter only the graded functional layer 530 will be illustrated for the convenience of explanation.

The graded functional layer 530 may have a first functional layer 531 disposed over the first organic light emitting layer 720a, a second functional layer 532 disposed over the second organic light emitting layer 720b, and a third functional layer 533 disposed over the third organic light emitting layer 720c. In this case, the first to the third functional layer 531, 532 and 533 may have different refractive indexes corresponding to the first to the third organic light emitting layers 720a, 720b and 720c.

The first functional layer 531 may include a first low refractive film 531a disposed over the first organic light emitting layer 720a and first high refractive film 531b disposed on the first low refractive film 531a. In this case, the first high refractive film 531b may have a convex lens shape with an upper region and a lower region.

The second functional layer 532 may include a second low refractive film 532a disposed over the second organic light emitting layer 720b and second high refractive film 532b disposed on the second low refractive film 532a. In this case, the second high refractive film 532b may have a convex lens shape with an upper region and a lower region.

The third functional layer 533 may include a third low refractive film 533a disposed over the third organic light emitting layer 720c and third high refractive film 533b disposed on the third low refractive film 533a. In this case, the third high refractive film 533b may have a convex lens shape with an upper region and a lower region.

The first to the third low refractive films 531a, 532a, and 533a may decide a profile of the lower regions of the first to the third high refractive films 531b, 532b, and 533b. In exemplary embodiments, the first to the third low refractive films 531a, 532a, and 533a may include a material different from that of the remaining first to third high refractive films 531a, 532a, and 533a. Additionally, the first to the third high refractive films 531b, 532b, and 533b may include a material different from that of the remaining first to third high refractive films 531b, 532b, and 533b.

FIG. 12 is a cross-sectional view illustrating an organic light emitting display device in accordance with another embodiment.

Referring to FIG. 12, an organic light emitting display device may include a substrate 110, a driving circuit unit DC, a first organic light emitting element 71, a second organic light emitting element 72, a third organic light emitting element 73, an encapsulating member 120, a graded functional layer 630, a black matrix 140, a color filter layer 150, etc. Hereinafter only the graded functional layer 630 will be illustrated for the convenience of explanation.

The graded functional layer 630 may have a first functional layer 631 disposed over the first organic light emitting layer 720a, a second functional layer 632 disposed over the second organic light emitting layer 720b, and a third functional layer 633 disposed over the third organic light emitting layer 720c. In this case, the first to the third functional layer 631, 632 and 633 may have different refractive indexes corresponding to the first to the third organic light emitting layers 720a, 720b and 720c.

The first functional layer 631 may include a first low refractive film 631a disposed over the first organic light emitting layer 720a and a first high refractive film 631b disposed on the first low refractive film 631a. In this case, the first high refractive film 631b may have a convex lens shape with an upper region and a lower region.

The second functional layer 632 may include a second low refractive film 632a disposed over the second organic light emitting layer 720b and a second high refractive film 632b disposed on the second low refractive film 632a. In this case, the second high refractive film 632b may have a convex lens shape with an upper region and a lower region.

The third functional layer 633 may include a third low refractive film 633a disposed over the third organic light emitting layer 720c and third high refractive film 633b disposed on the third low refractive film 633a. In this case, the third high refractive film 633b may have a convex lens shape with an upper region and a lower region.

The first to the third low refractive films 631a, 632a, and 633a may decide a profile of the lower regions of the first to the third high refractive films 631b, 632b, and 633b. In exemplary embodiments, the first to the third low refractive films 631a, 632a, and 633a may include a material different from that of the remaining first to third high refractive films 631b, 632b, and 633b. Additionally, the first to the third high refractive films 631b, 632b, and 633b may include a material different from that of the remaining first to third high refractive films 631b, 632b, and 633b.

Therefore, the organic light emitting display device according to exemplary embodiments may include the black matrix and the color filter layer. Accordingly, the organic light emitting display device may have an improved contrast. Furthermore, the organic light emitting display device may further include the graded functional layer with at least one of the low refractive films and the high refractive films so that light generated from the organic light emitting element may be effectively amplified due to difference of refractive index between the low refractive film and the high refractive film. Thus, the organic light emitting display device may have an improved optical efficiency. In this case, the organic light emitting display device may prevent a color shift in which the light generated from the organic light emitting element may be scattered due to the shape of the low refractive films and the high refractive films.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. An organic light emitting display device comprising:
a substrate;
a plurality of organic light emitting elements disposed on the substrate, the plurality of organic light emitting elements including a first organic light emitting element, a second organic light emitting element and a third organic light emitting element;
an encapsulating member encapsulating the plurality of organic light emitting elements;
graded functional layers disposed on the encapsulating member, the graded functional layers including convex lenses and concave lenses disposed on pixel regions, and connecting portions connecting adjacent convex lenses; and
a black matrix disposed on each of the connecting portions of the graded functional layers,
wherein the concave lenses are disposed closer to the encapsulating member than the convex lenses,
wherein the graded functional layers comprise a low refractive film and a high refractive film having a refractive index higher than that of the low refractive film and on the low refractive film,
wherein the convex lenses are formed of the high refractive film, the convex lenses including a first convex lens disposed on the first organic light emitting element, a second convex lens disposed on the second organic light emitting element and a third convex lens disposed on the third organic light emitting element,
wherein each of the first convex lens, the second convex lens and the third convex lens has an upper region disposed above an upper surface of the connecting portions and a lower region disposed below a lower surface of the connecting portions, and
wherein the third convex lens has a flat portion directly on its lower region.

2. The organic light emitting display device of claim 1, wherein the first organic light emitting element is a red organic light emitting element, the second organic light emitting element is a green organic light emitting element and the third organic light emitting element is a blue organic light emitting element.

3. The organic light emitting display device of claim 2, wherein each of the first convex lens and the second convex lens do not have a flat portion directly on their lower region.

4. The organic light emitting display device of claim 3, wherein a width of the third convex lens is different from those of the first convex lens and the second convex lens, and
wherein the width of the first convex lens, the second convex lens and the third convex lens are measured from a region where radius of curvatures of the first convex lens, the second convex lens and the third convex lens are started to a region where radius of curvatures of the first convex lens, the second convex lens and the third convex lens are ended.

5. The organic light emitting display device of claim 3, wherein a taper angle of the lower region in the third convex lens is different from that of the lower region in the first convex lens and the lower region in the second convex lens.

6. The organic light emitting display device of claim 3, wherein a taper angle of the upper region in the third convex lens is different from that of the upper region in the first convex lens and the upper region in the second convex lens.

7. An organic light emitting display device comprising:
a substrate;
a plurality of organic light emitting elements disposed on the substrate, the plurality of organic light emitting elements including a first organic light emitting element, a second organic light emitting element and a third organic light emitting element;
an encapsulating member encapsulating the plurality of organic light emitting elements;
graded functional layers disposed on the encapsulating member, the graded functional layers including convex lenses and concave lenses disposed on pixel regions, and connecting portions connecting adjacent convex lenses; and
a black matrix disposed on each of the connecting portions of the graded functional layers,
wherein the concave lenses are disposed closer to the encapsulating member than the convex lenses,
wherein the graded functional layers comprise a low refractive film and a high refractive film having a refractive index higher than that of the low refractive film and on the low refractive film,
wherein the convex lenses are formed of the high refractive film, the convex lenses including a first convex lens disposed on the first organic light emitting element, a second convex lens disposed on the second organic light emitting element and a third convex lens disposed on the third organic light emitting element,
wherein the first organic light emitting element is a red organic light emitting element, the second organic light emitting element is a green organic light emitting element and the third organic light emitting element is a blue organic light emitting element,
wherein each of the first convex lens, the second convex lens and the third convex lens has an upper region disposed above an upper surface of the connecting portions and a lower region disposed below a lower surface of the connecting portions, and
wherein each of the first convex lens and the second convex lens has a flat portion directly on their upper region and the third convex lens does not have a flat portion directly on its upper region.

8. The organic light emitting display device of claim 7, wherein a width of the third convex lens is different from that of the first convex lens and the second convex lens.

9. The organic light emitting display device of claim 7, wherein a taper angle of the lower region in the third convex lens is different from that of the lower region in the first convex lens and the lower region in the second convex lens.

10. The organic light emitting display device of claim 7, wherein a taper angle of the upper region in the third convex lens is different from that of the upper region in the first convex lens and the upper region in the second convex lens.

11. The organic light emitting display device of claim 7, wherein a height of the lower region in the third convex lens are different from that of the lower region in the first convex lens and the lower region in the second convex lens, and
wherein the height of the lower region in the first convex lens, the second convex lens and the third convex lens are measured from a surface of the connecting portions.

12. The organic light emitting display device of claim 1, wherein the first organic light emitting element, the second organic light emitting element and the third organic light emitting element are white organic light emitting elements.

13. The organic light emitting display device of claim 12, wherein a width of the third convex lens is different from those of the first convex lens and the second convex lens, and
wherein the width of the first convex lens, the second convex lens and the third convex lens are measured from a region where radius of curvatures of the first convex lens, the second convex lens and the third convex lens are started to a region where radius of curvatures of the first convex lens, the second convex lens and the third convex lens are ended.

14. The organic light emitting display device of claim 13, wherein a taper angle of the third convex lens is different from that of the first convex lens and the second convex lens.

15. The organic light emitting display device of claim 12, wherein a taper angle of the third convex lens is different from that of the first convex lens and the second convex lens.

* * * * *